United States Patent
Delacruz et al.

(10) Patent No.: US 11,127,738 B2
(45) Date of Patent: Sep. 21, 2021

(54) BACK BIASING OF FD-SOI CIRCUIT BLOCKS

(71) Applicant: Xcelsis Corporation, San Jose, CA (US)

(72) Inventors: Javier A. Delacruz, San Jose, CA (US); David Edward Fisch, Pleasanton, CA (US); Kenneth Duong, San Jose, CA (US); Xu Chang, San Jose, CA (US); Liang Wang, Milpitas, CA (US)

(73) Assignee: Xcelsis Corporation, San Jose, CA (US)

( * ) Notice: Subject to any disclaimer, the term of this patent is extended or adjusted under 35 U.S.C. 154(b) by 31 days.

(21) Appl. No.: 15/892,734

(22) Filed: Feb. 9, 2018

(65) Prior Publication Data

US 2019/0252375 A1    Aug. 15, 2019

(51) Int. Cl.
*H01L 23/00* (2006.01)
*G11C 5/14* (2006.01)
*H01L 21/822* (2006.01)
(Continued)

(52) U.S. Cl.
CPC .. *H01L 27/0688* (2013.01); *H01L 21/823475* (2013.01); *H01L 21/84* (2013.01); *H01L 24/08* (2013.01); *H01L 25/065* (2013.01); *H01L 27/088* (2013.01); *H01L 27/1203* (2013.01); *H03K 17/687* (2013.01); *G11C 5/147* (2013.01);
(Continued)

(58) Field of Classification Search
CPC ............... H01L 27/0688; H01L 27/088; H01L 21/823475; H01L 21/84; H01L 25/065; H01L 27/1203; H01L 24/08; H01L 2224/80895; H01L 2224/32145; H01L 24/29; H01L 2224/29186; H01L 2224/83896; H01L 2224/056; H01L 2924/14; H01L 2224/08146; H01L 24/80; H01L 24/83; H01L 24/05; H01L 2224/08148; H01L 21/8221; H01L 2225/06524; H01L 25/0657; H03K 17/687; G11C 5/147; G11C 5/146; G11C 11/413
See application file for complete search history.

(56) References Cited

U.S. PATENT DOCUMENTS 8,816,754 B1 *  8/2014  Clark ................... H03K 17/145
                                                       327/534
10,378,967 B1 *  8/2019  Vogelsang .......... H01L 27/1203
(Continued)

OTHER PUBLICATIONS http://www.techdesignforums.com/practice/guides/fd-soi/.
(Continued)

*Primary Examiner* — Benjamin Tzu-Hung Liu
(74) *Attorney, Agent, or Firm* — Lerner, David, Littenberg, Krumholz & Mentlik, LLP

(57) ABSTRACT

A microelectronic circuit structure comprises a stack of bonded layers comprising a bottom layer and at least one upper layer. At least one of the upper layers comprises an oxide layer having a back surface and a front surface closer to the bottom layer than the back surface, and a plurality of FD-SOI transistors built on the front surface. At least a first back gate line and a second back gate line extend separate from each other above the back surface for independently providing a first back gate bias to a first group of transistors and a second back gate bias to a second different group of transistors.

18 Claims, 4 Drawing Sheets

(51) Int. Cl.
  *H01L 25/065* (2006.01)
  *H01L 27/06* (2006.01)
  *H01L 27/12* (2006.01)
  *H03K 17/687* (2006.01)
  *H01L 27/088* (2006.01)
  *H01L 21/8234* (2006.01)
  *H01L 21/84* (2006.01)

(52) U.S. Cl.
  CPC ............ *H01L 24/05* (2013.01); *H01L 24/29* (2013.01); *H01L 24/80* (2013.01); *H01L 24/83* (2013.01); *H01L 2224/056* (2013.01); *H01L 2224/08146* (2013.01); *H01L 2224/08148* (2013.01); *H01L 2224/29186* (2013.01); *H01L 2224/32145* (2013.01); *H01L 2224/80895* (2013.01); *H01L 2224/83896* (2013.01); *H01L 2924/14* (2013.01)

(56) References Cited

U.S. PATENT DOCUMENTS

| | | | | |
|---|---|---|---|---|
| 2014/0103533 A1* | 4/2014 | Bedell | ............... | H01L 21/76898 257/773 |
| 2014/0292374 A1* | 10/2014 | Giraud | ............... | H01L 27/0928 326/98 |
| 2015/0333056 A1* | 11/2015 | Du | ................. | H01L 21/8221 257/773 |
| 2016/0117584 A1* | 4/2016 | Yoneda | ............. | G06K 19/0716 235/492 |
| 2019/0004895 A1* | 1/2019 | Lee | ................. | G11C 11/005 |

OTHER PUBLICATIONS

N.G. Tarr et al., "A simple implanted backgate MOSFET for dynamic threshold control in fully-depleted SOI CMOS," Proceedings 1996 IEEE International SOI Conference, Oct. 1996, pp. 76-77.

Xu et al., "Compact Capacitance and Capacitive Coupling-Noise Modeling of Through-Oxide vias in FDSOI Based Ultra-High Density 3-D ICs" 978-1-4577-0505-2/11/ IEEE, pp. 34.8.1-34.8.4.

Gaynor, Brad D. et al "Parasitic Back-Gate Effect in 3-D Fully Depleted Silicon on Insulator Integrated Circuits", IEEE Transactions on Components, Packaging and Manufacturing Technology, pp. 1-9.

* cited by examiner

BACK BIASING OF FD-SOI CIRCUIT BLOCKS

FIELD

The present invention relates to a 3D microelectronic circuit structure including a plurality of die stacked on one another and wherein an upper die in the stack comprises back biased Fully depleted silicon-on-insulator (FD-SOI) circuit blocks.

BACKGROUND

FD-SOI, also known as ultra-thin or extremely thin silicon-on-insulator (ET-SOI), is an alternative to bulk silicon as a substrate for building transistors, such as CMOS devices. The construction process of a wafer with FD-SOI transistors starts with growing a thin layer of oxide, called the buried oxide (BOX), on a bulk silicon wafer; the layer of oxide acts as an insulator. A very thin (shallow) layer of epitaxial silicon is then grown on top of the oxide layer for implementing a channel for transistors; this top silicon layer is fully depleted, i.e. it does not have any intrinsic charge carrier. The process then continues by realizing the gate, source and drain of the transistors on the obtained FD-SOI substrate, as well as the required inter-connections between transistors.

As such, a transistor built on a FD-SOI substrate has a very thin (shallow) channel, which improves the ability of the gate to remove carriers from that channel when the device needs to be switched-off. Furthermore, the drain-induced barrier lowering (DIBL) that makes it more difficult to turn devices fully off is greatly reduced by the presence of the insulating oxide layer directly beneath the channel.

Thus, FD-SOI offers better performance than conventional bulk silicon in deep submicron process technologies, with particular benefits for low-power circuits. As such, FD-SOI is a leading technology for low-power/low-leakage circuits. For example, according to the SOI Industry Consortium, benchmarks show that using FD-SOI makes it possible to reduce the operating voltage in SRAM cells by 100-150 mV. As such, the operating-voltage reduction afforded by FD-SOI could enable a 40% reduction in memory-array power consumption.

Another advantage of FD-SOI over technologies such as finFET, as well as planar transistors, resides in the possibility to back bias the channels of the transistors in order to provide greater control over the charge carriers flowing through the channels. As such, a bias voltage applied at the back side of the SOI substrate can be used for controlling the threshold voltage of the transistors built on the front side of the SOI substrate.

Referring for example to the article available at http://www.techdesignforums.com/practice/guides/fd-soi/, it is known that dynamically adjusting bias-levels of the transistors allows a circuit to be faster when required, and more energy efficient when performance is not as critical. Thus, increasing the threshold voltage results in a leakage reduction but with transistors become slower. On the other hand, decreasing the threshold voltage results in faster transistors, although with increasing leakage.

Separately, it is further known to dynamically adjust bias-levels in response to process variations and changes in temperature as disclosed in "A simple implanted backgate MOSFET for dynamic threshold control in fully-depleted SOI CMOS" by N. G. Tarr et al.

Referring for example to "Compact capacitance and capacitive coupling-noise modelling of Through-Oxide Vias in FDSOI based ultra-high density 3-D ICs" by Xu et al, it is known that die containing FD-SOI integrated circuits (ICs) can be stacked in order to realize a 3D circuit structure, where the devices of the stacked die can be interconnected through TOVs (Through-Oxide Vias).

Separately, it is known from "Parasitic Back-Gate Effect in 3-D Fully Depleted Silicon on Insulator Integrated Circuits", by Brad D et al, to provide back biasing to the transistors within upper layers of a 3D FD-SOI stacked structure.

SUMMARY

According to a first aspect of the present invention there is provided a microelectronic circuit structure according to claim 1.

According to a second aspect and a third aspect there are provided microelectronic circuits according to claims 14 and 18, respectively.

Embodiments of the invention provides a selective back biasing to different regions of transistors within any given upper FD-SOI layer of a 3D circuit stacked structure.

Selectively providing different bias to different groups of transistors within a stacked microelectronic circuit structure allows parts of a system to operate at higher performance levels without simultaneously causing an entire system to be leakier.

These different regions can correspond to different functional circuit blocks within the given layer, having different optimal performances. In this case, selective back biasing is advantageously used to independently provide different back bias signals to the different circuit blocks, as required to reach optimal performances thereof. In this way, an optimal operation for different functional circuit blocks can be achieved, rather than selecting a bias level optimal for one circuital block and indiscriminately imposing it to all the other circuital blocks.

In another case, one region can be affected by parameter variations introduced in the foundry process differently than other regions within the given layer. In this case, upon identification of this region based on measurements, independent back gate lines can be devised accordingly for the given layer. Selective back biasing can then be advantageously applied for compensating the effects of the process variations, by tuning the bias level for the identified region independently to the bias level applied to the other regions. In this way, process variation effects can be controlled at a circuital block-level, instead of predisposing wafer lots that may still have variations built in.

BRIEF DESCRIPTION OF THE DRAWINGS

Embodiments of the invention will now be described, by way of example, with reference to the accompanying drawings, in which.

DESCRIPTION OF THE EMBODIMENTS

Figure 1:
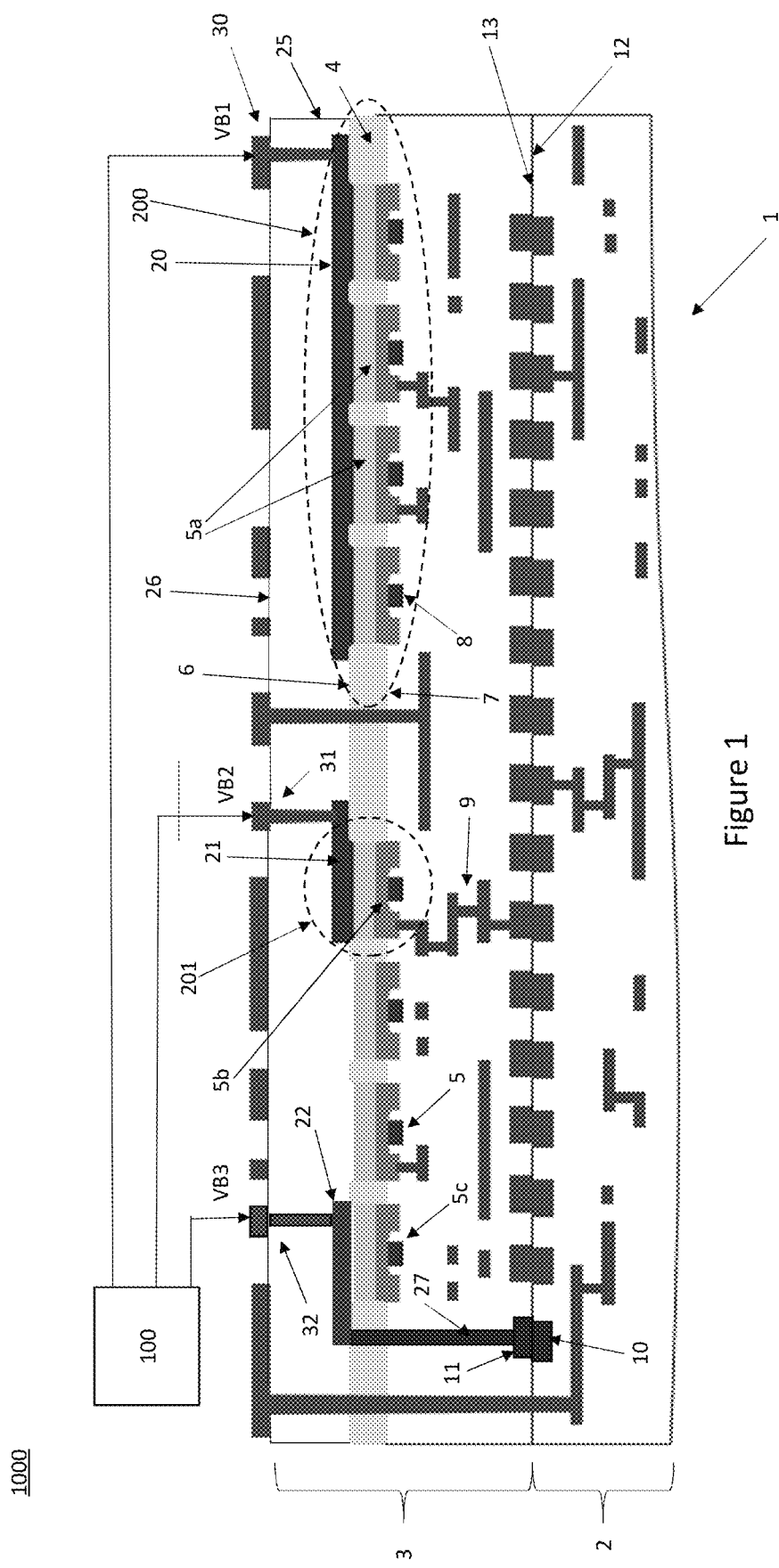
FIG. 1 illustrated a microelectronic circuit comprising a two-layers 3D circuital structure according to a first embodiment of the present invention.

Referring to FIG. 1 there is shown schematically a microelectronic circuit 1000 comprising a stack 1 of two bonded layers, namely a bottom layer 2 and an upper layer 3 stacked onto the bottom layer 2.

Layers 2 and 3 are bonded through direct bonding interconnect (DBI®), which is a low temperature hybrid direct bonding technology developed by the Applicant and which allows layers comprising either wafers or die to be bonded with exceptionally fine pitch electrical interconnections, without any pressure or adhesives.

As illustrated in FIG. 1, DBI involves a plurality of bond pads 10, 11 disposed at bonding surfaces 12, 13 of the layers 2, 3; during the bonding process, the pads 10, 11 expand into one another to form a homogeneous metallic interconnect. In this way, interconnections can occur at the bonding surface 12, 13, thus minimizing the need for TSVs (Through Silicon Vias) or similar interconnections.

Layer 2 preferably comprises a SOI IC; but alternatively, layer 2 can comprise a bulk IC or any other type of semiconductor IC.

Layer 3 comprises a FD-SOI IC; in particular, layer 3 comprises a thin oxide layer 4 used for building the FD-SOI transistors 5. The oxide layer 4 has a back surface 6 and a front surface 7 which is closer to the bottom layer 2 than the back surface 6; the FD-SOI transistors 5 are built on the front surface 7 of the oxide layer 4 in such a way to present front gates 8 facing the bottom layer 2.

As illustrated in FIG. 1, layer 3 comprises various connections frontally provided to the transistors 5, among which connections 9 connect transistors 5 to respective DBI pads 11. In this way, the transistors 5 can be connected when required to circuit parts within the bottom layer 2.

Referring now to the back portion of layer 3, FIG. 1 illustrates three back gate lines 20, 21, 22 of conductive material separated from each other and extending on the back surface 6 of the oxide layer 4. (Note that the silicon substrate used for growing the SOI substrate of the transistors 5 has been removed, e.g. by etching, during the production of the layer 3; in this way, the rear surface 6 of the oxide layer 4 becomes exposed for depositing thereon lines 20, 21, 22.)

In particular, as illustrated in FIG. 1, lines 20, 21, 22 extend separately on the back surface 6 of the oxide layer 4 and are disposed above corresponding different groups of underlying transistors 5a, 5b, 5c which are separated from the lines 20, 21, 22 by the oxide layer 4. In particular, the sectional view of FIG. 1 illustrates four transistors 5a of the transistor group below the corresponding line 20, one transistor 5b of the transistor group below the corresponding line 21, and one transistor 5c of the transistor group below the corresponding line 22. A passivation layer 25 covers the back surface 6 of the oxide layer 4 and the lines 20, 21, 22.

FIG. 1 further illustrates schematically power supply circuitry 100 for selectively supplying back gate bias signals VB1, VB2 and VB3 to the back gate lines 20, 21 and 22, respectively, through separated upper interconnections 30, 31, 32. The upper interconnections 30, 31, 32 pass through the passivation layer 25 and are available for connection at an upper surface 26 of the passivation layer 25; for example, as illustrated in FIG. 1, the interconnections 30, 31, 32 can comprise contacts extending along the surface 26. In this way, lines 20, 21, 22 can be used to separately provide the back gate bias signals VB1, VB2 and VB3 to the corresponding groups of transistors 5a, 5b and 5c; as such, the lines 20, 21, 22 act as back gates for controlling the channels of the corresponding groups of transistors 5a, 5b, 5c.

FIG. 1 further illustrates how the line 22 is connected, through a via 27, to a respective pad 11 at the bonding interface between the layers 2, 3. In this way, the bias signal VB3 can be provided when required to one or more circuit parts of the bottom layer 2; or alternatively the bias signal VB3 can be provided from circuitry such as circuitry 100 through the bottom layer 2.

Figure 2:
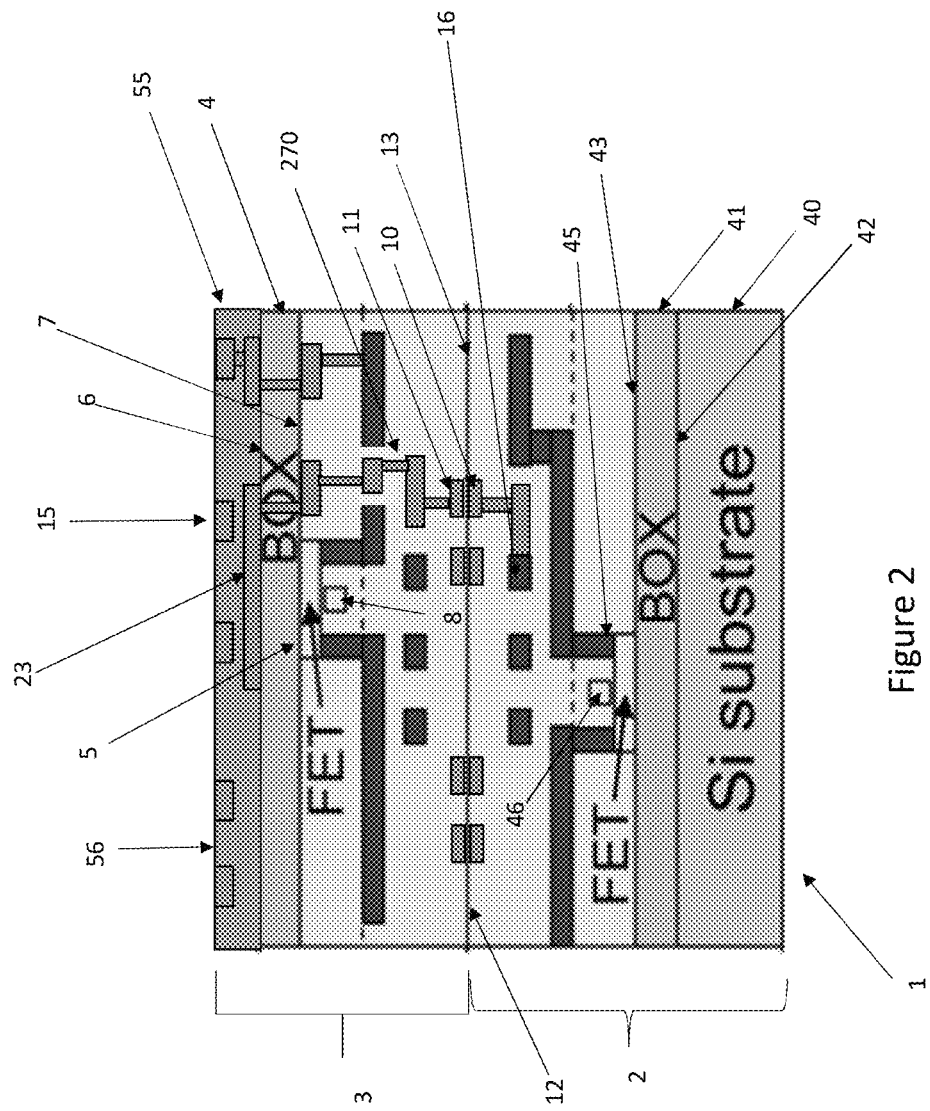
FIG. 2 illustrates a sectional view of a portion of two layers within a 3D circuital structure according to a second embodiment of the present invention.

With reference now to FIG. 2, there is illustrated a portion of two layers 2, 3 of a stack 1 according to another embodiment. The surfaces 12, 13 of layers 2, 3 are bonded to each other through DBI as above disclosed for the layers 2, 3 illustrated in FIG. 1.

The bottom layer 2 of the stack 1 comprises a FD-SOI IC. In particular, the bottom 2 comprises a lower silicon substrate 40, and a thin oxide layer 41 used for building the FD-SOI transistors 45. The oxide layer 41 has a back surface 42 laying on the silicon substrate 40 and a front surface 43 which is closer to the upper layer 3 than the back surface 42. The FD-SOI transistors 45 are built on the front surface 42 of the oxide layer 40 in such a way to present front gates 46 facing the upper layer 3. This lower layer 2 partially illustrated in FIG. 2 also provides an example of how the lower layer 2 of the stack 1 illustrated in FIG. 1 can be realized.

Figure 3:
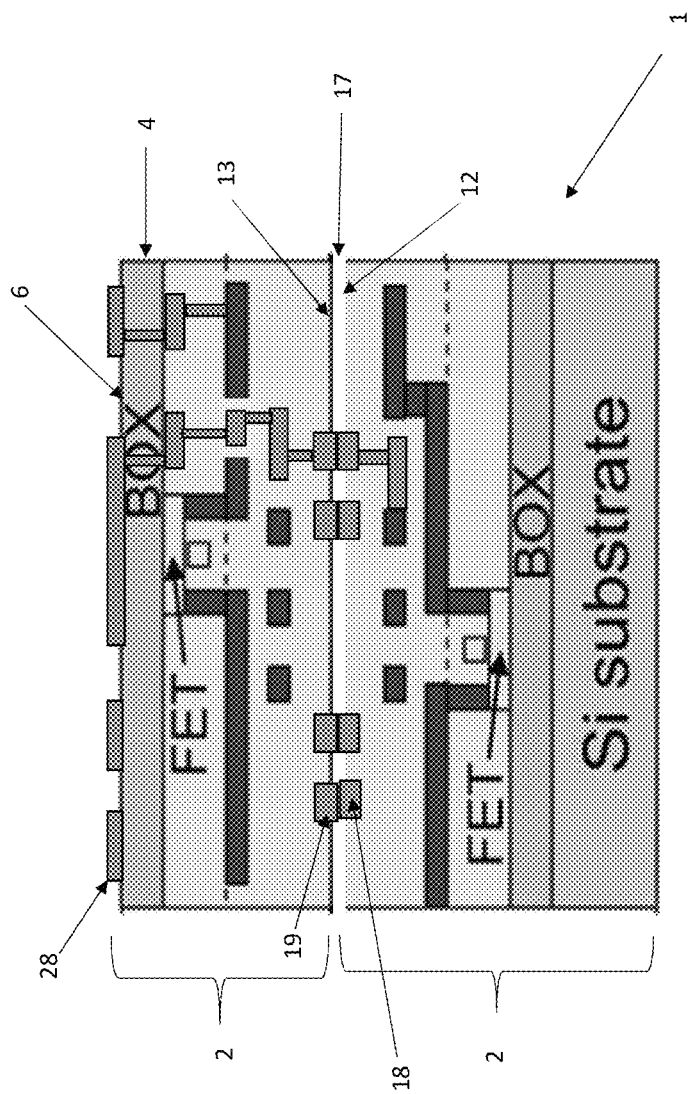
FIG. 3 illustrates a sectional view of a portion of two layers within a 3D circuital structure according to a third embodiment of the present invention.

Although partially illustrated, the upper layer 3 in FIG. 2 has a structure similar to the structure of the upper layer 3 illustrated in FIG. 1. In particular, only one transistor 5 is illustrated in FIG. 3, having its frontal gate 8 facing to the bottom layer 2. As such, the layers 2, 3 are bonded in such a way that their transistors 45 and 5 are disposed face-to-face.

Referring now to the back portion of the upper layer 3, a back gate line 23 of conductive material extends on the back surface 6 of the oxide layer 4, so as to be placed above and act as back gate for a corresponding group of transistors 5 (only one of which viewable in the sectional view of FIG. 2). Although not viewable in the partial illustration of FIG. 2, one or more other back gate lines can extend on the back surface 6 of the oxide layer 4 separated from the line 23, so as to cover corresponding different groups of transistors similarly to the embodiment illustrated in FIG. 1. Interconnections 270 connect the back gate line 23 to a corresponding DBI pad 11 which in turn is connected, through the coupled DBI pad 10, to a contact 16 provided within the bottom layer 2.

The embodiment illustrated in FIG. 2 differs from the embodiment of FIG. 1 in the realization of the upper connections for the layer 3. In particular, a further layer of oxide 55 covers the back surface 6 of the oxide layer 4 and the back gate line 23. Pads 15 for DBI bonding are exposed at an upper surface 56 of the layer 55. At least one of the DBI pads 15 is connected to the line 23 to provide thereto a corresponding back gate bias signal for the underlying transistors 5. In this way, layer 3 is arranged to be DBI bonded to a further upper layer (not shown) for realizing a 3D structure comprising three or more layers.

Such a further upper layer can comprise another FD-SOI IC provided with separate back gate lines for corresponding underlying different groups of transistors. In this case, at least some of the back gate lines associated with the layer 3 can be unconnected to the back gate lines associated with the upper layer, so that the back gate lines associated with the layer 3 and the back gate lines associated with the upper layer can independently provide back biasing signals to the corresponding underlying groups of transistors.

Especially in case that the layer 3 and the upper layer comprise groups of transistors belonging to same or similar functional circuit blocks, the corresponding back gate lines associated with the layer 3 and back gate lines associated with the upper layer can be connected to each other, e.g. through interconnections at the DBI interface between the layers. In this way, back gate lines at the different layers can provide same back gate bias signals to circuit blocks within the layer 3 and the upper layer having the same or similar functionality or performance.

Referring now to FIG. 3 there is illustrated a portion of two layers 2, 3 of a stack 1 according to another embodiment of the presented invention. The embodiment illustrated in FIG. 3 differs to the embodiment illustrated in FIG. 2 in the way in which layer 3 is bonded to the bottom layer 2 and is arranged to be bonded to a further upper layer (not shown). In particular, a non-hybrid bonding solution is used instead of DBI. This solution involves metal-to-metal bonding between pads 18 and 19 at the bonding surfaces 12, 13 of the layers 2 and 3, leaving a small gap 17 between these surfaces 12, 13.

In order to apply a similar metal-to-metal bonding between the layer 2 and the upper layer, metal pads 28 are also disposed at the back surface 6 of the metal oxide 4, together with line 23.

Referring back to FIG. 1, exemplary applications of selective back bias on the transistors 5 of the layer 2 are disclosed.

In one application, the group of transistors 5a below the back gate line 20 and the group of transistors 5b below the back gate line 21 belong to two different functional circuit blocks 200, 201; for example, the blocks 200, 201 can be different memories of various types, logic circuit blocks, digital circuit blocks, analogue circuit blocks, processors, etc.

It is to be understood that although FIG. 1 schematically illustrates only one transistor 5b underlying the back gate line 21 and belonging to circuit 201, circuit 201 can comprise more adjacent rows of transistors 5 and line 21 can extend accordingly on the back surface 6 of the oxide layer 4 to cover also these adjacent rows.

For example, circuit block 200 can be a processor 200 and circuit block 201 can be a memory 201, wherein the processor 200 and memory 201 have different optimal performance points which depend on various parameters, among which the threshold voltage which influences the leakage and switching frequency of the transistors.

As such, the processor 200 can perform at best at a given back bias level for its transistors 5a, and the memory 201 can perform best at a given different bias level for its transistors 5b.

Accordingly, as illustrated in FIG. 1, different back gate bias signals VB1 and VB2 can be supplied by the power supply circuitry 100 to the respective back gate lines 20 and 21 for being selectively provided to the transistors 5a of the processor 200 and the transistors 5b of the memory 201.

Furthermore, independently providing signals VB1 and VB2 through the separate back gate lines 20, 21 not only allows signals VB1, VB2 to be provided with different voltage values, but also allows VB1, VB2 to independently vary dynamically over time. In the specific example, the back bias signal VB1 can be advantageously varied according to different states of the processor 200.

In particular, the processor 200 can be in an idle standby state, where no activity is required, and wake up to an operating state when required. In the standby state leakage is a critical aspect for the performance of processor 200, while processing speed becomes a more relevant aspect when the processor 200 switches to an operational state. Accordingly, the power supply circuitry 100 can supply the back gate bias signal VB1 having a first value for minimizing the leakage in the transistors 5a when the processor 200 is in the idle state, and to change from this low-leakage bias value to a second different value when the processor 200 switches to an operating state. In particular, the second value of the back gate bias signal can be adjusted by the circuitry 100 according to the processing speed and power consumption required to the processor 200 by a fluctuating computational workload.

On the other hand, the memory 201 may require a minimum bias level for its transistors 5b in order to stably retain the states in the memory cells realized by the transistors 5b. As such, the use of selective back biasing between the processor 200 and the memory 201 is particularly advantageous, because indiscriminately applying a low-leakage bias value to the processor 200 in the idle state and the memory 201 could result in the memory 201 being unable to retain its bit states.

In another example, the circuit block 200 and the circuit block 201 can comprise a cache memory 200 and normal SRAM or DRAM memory 201, respectively, wherein the cache memory 200 requires a faster/higher power consumption operational mode than the normal memory 201. As such, the cache memory 200 can optimally perform at a back bias level which increases the switching frequency of its transistors 5a, while the normal memory 201 can optimally perform at a different back bias level which in contrast decreases the switching frequency of its transistors 5b. Accordingly, different back gate bias signals VB1 and VB2 can be supplied by the power supply circuitry 100 to the respective back gate lines 20 and 21 for being separately applied to the transistors 5a of the cache memory 200 and the transistors 5b of the normal memory 201.

Figure 4:
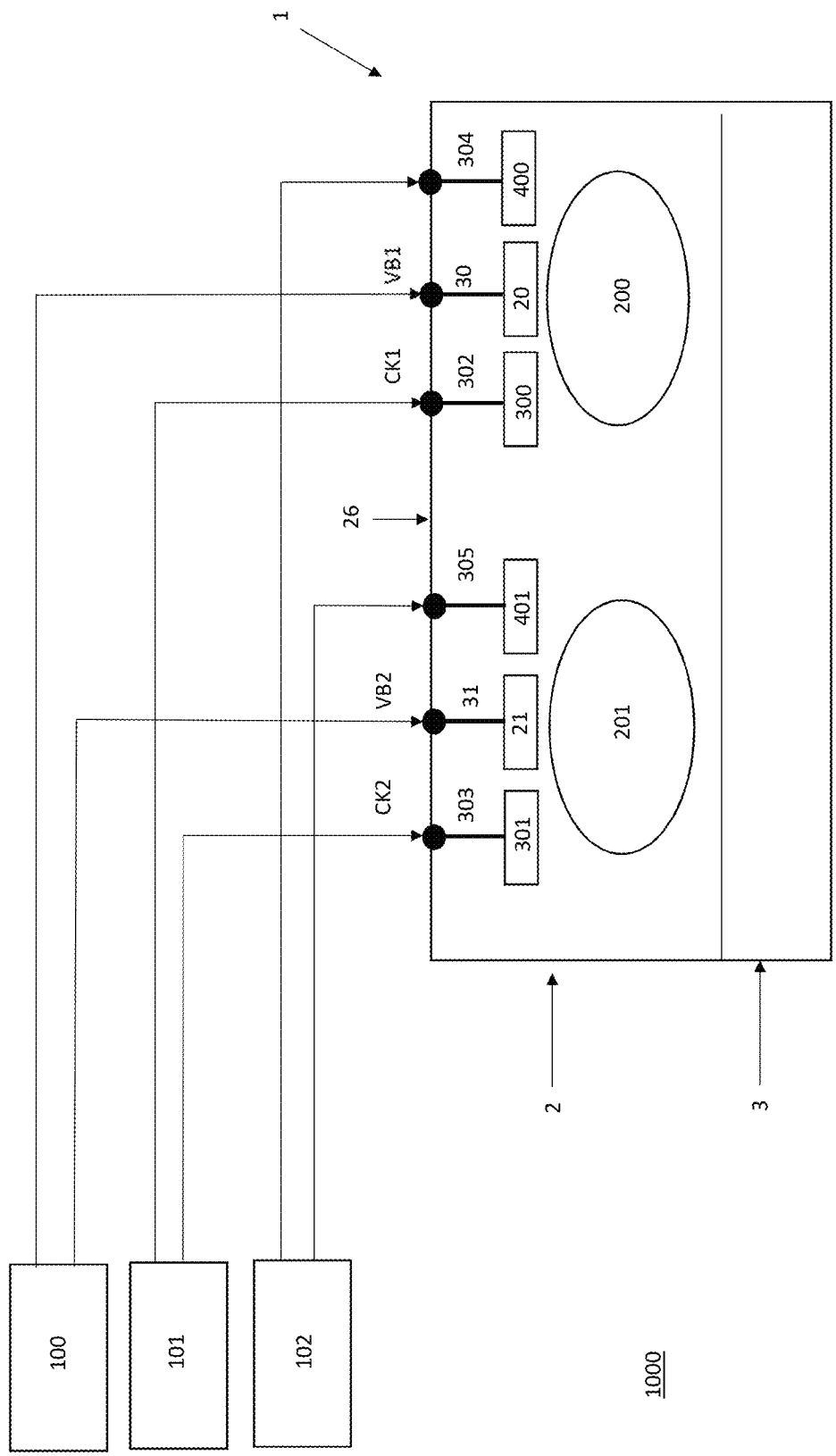
FIG. 4 schematically illustrates a microelectronic circuit according to an embodiment of the present invention.

Reference is now made to FIG. 4, where there is shown schematically how several lines and respective interconnections are associated with the cache and normal memories 200, 201, in addition to the back gate lines 20, 21 and respective interconnections 30, 31.

In particular, the illustrated stacked structure 1 comprises a first clock line 300 and a separated second clock line 301 for independently providing a higher-frequency clock signal CK1 and a lower-frequency clock signal CK2 to the cache memory 200 and the normal memory 201 within the upper layer 3. In addition to the power supply circuitry 100, the circuit 1000 illustrated in FIG. 4 comprises clock generating circuitry 101 configured to independently supply the clock signals CK1 and CK2 to the clock lines 300 and 301, respectively. For example, as schematically illustrated in FIG. 4, the clock lines 300 and 301 can be within the layer 3 and accessible by the clock generating circuitry 101 through respective interconnections 302 and 303 accessible at the upper surface 26 of the layer 3.

Furthermore, the illustrated stacked structure 1 comprises a plurality of faster data lines 400 and slower data lines 401 (cumulatively represented by single lines in FIG. 4) for writing/reading data into/from the cache memory 200 and the normal memory 201, respectively. The circuit 1000 illustrated in FIG. 4 further comprises memory control circuitry 102 connected to the faster data lines 400 and the slower data lines 401 through separated interconnections 304 and 305 and configured to selectively control the data lines 400, 401 to write/read data into/from the cache and normal memories 200, 201. For example, as schematically illustrated in FIG. 4, the data lines 400 and 401 can be within the layer 3 and accessible by the memory control circuitry 102 through respective interconnections 304 and 305 accessible at the upper surface 26 of the layer 3.

Again, referring back to FIG. 1, another application of selective back biasing assumes that the performance of the group of transistors 5c within layer 3 is significantly affected by variations of nominal transistor parameters due to the foundry process, while the other transistors 5a, 5b within the layer 3 are not or differently effected by process variations. One of the factors causing process variations is how rich the N and/or P dopants are in the silicon; there are also variations in the frontal gate 8 length or width, the width being more critical than the length. Due to process variations, the transistors 5c can run slower or faster than specified and at lower or higher temperatures and voltages.

In this scenario, the power supply circuitry 100 can supply a back gate bias signal VB3 to the back gate line 22, having a voltage value calculated so as to compensate the undesired effects on the transistors 5c introduces by the processor variations; the suitable voltage value to be supplied can be determined based on measurements on the effected transistors 5c. Thus, this correcting back gate bias signal VB3 can be provided by the back gate line 22 to the transistors 5c, without affecting the back gate bias levels devised for the other transistors 5a and 5b within the layer 3.

As evident from the exemplary applications discussed above, selective back biasing operates on a "per-block" basis. It can be desirable that the circuit regions independently controlled by the back gate lines be limited to a small size of a particular circuit block, such as a memory, a processor, an analog sub-circuit, or a circuit region particularly affected by process variations. As such, there can be applications where a fine granularity of separate back gate lines may be required for corresponding small sized circuit areas.

In this case, DBI bonding between the layers of the stacked structure 1 becomes particularly advantageous because it provides a high density of interconnects between the stacked layers, required by such a granular arrangement of back gate lines. This is even more relevant when several other lines are operatively associated with the different circuit blocks controlled by the back gate lines, such as in the embodiment illustrated in FIG. 4.

The stacked structures 1 illustrated in FIGS. 1-4 can be realized by wafer-to-wafer, die-to-wafer, or die-to-die bonding. In particular, a die of the upper layer 3 can comprise different functional circuit blocks or regions selectively back biased as above disclosed.

Also note that while the stacks illustrated in FIGS. 1-4 only show one layer stacked on top of one another, in other applications more than one die may be stacked on a given lower layer.

Note that FIGS. 1-4 are not shown to scale and especially the size of the bond pads 10, 11 may be significantly larger than the size of the transistors 5.

It to be understood that the number of layers of a stacked structure, the number of back gate lines and the number of corresponding underlying transistors within a given layer can be different according to different applications.

The invention claimed is:

1. A microelectronic circuit structure comprising a stack of bonded layers including a bottom layer and at least one upper layer, the at least one upper layer comprising an oxide layer having a back surface and a front surface closer to said bottom layer than said back surface, a plurality of fully depleted silicon-on-insulator (FD-SOI) transistors built on the front surface of the oxide layer; and at least a first back gate line and a second separate back gate line in direct contact with and extending above the back surface of the oxide layer for independently providing a first back gate bias to a first group of said plurality of transistors and a second back gate bias to a second different group of said plurality of transistors and maintaining a third group of said plurality of transistors free from electrical communication with the first and second back gate lines and other back gate lines, wherein a first circuit block comprises said first group of said plurality of transistors and a second circuit block comprises said second group of said plurality of transistors, wherein the first and the second circuit blocks are different types of functional circuit blocks configured to receive the independent first and second back gate bias respectively, wherein an end of the first back gate line extends on the oxide layer and vertically overlaps a region defined between the first and the second groups of the transistors, wherein said at least one upper layer comprises a first upper layer and a second upper layer, wherein the second upper layer is bonded to the first upper layer through direct bonding interconnect (DBI), and wherein first back gate lines for providing said first back gate bias to respective transistors of the first and second upper layers in said first group are connected to each other.

2. The circuit structure according to claim 1, wherein said bottom layer comprises a SOI integrated circuit.

3. The circuit structure according to claim 2, wherein said bottom layer comprises: a lower silicon substrate, an oxide layer having a back surface and a front surface closer to said upper layer than said back surface, and a plurality of FD-SOI transistors built on the front surface of said oxide layer.

4. The circuit structure according to claim 1, wherein said at least one upper layer comprises at least the first upper layer bonded to the bottom layer through direct bonding interconnect (DBI).

5. The circuit structure according to claim 1, wherein second back gate lines for providing said second back gate bias to respective transistors of the first and second upper layers in said second group are unconnected to each other for independently providing said second back gate bias to the respective transistors of the first and second upper layers in said second group.

6. The circuit structure according to claim 1, wherein said upper layer comprises at least first and second different functional circuit blocks, the first back gate bias provided to the first circuit block is different from the second back gate bias provided to comprising said first group of transistors and the second circuit block comprising said second group of transistors.

7. The circuit structure according to claim 6, wherein said first circuit block comprises a higher-frequency operating circuit block and said second circuit block comprises a slower frequency operating circuit block.

8. The circuit structure according to claim 7, comprising at least a first clock line and a separate second clock line for independently providing a higher-frequency clock signal and a lower-frequency clock signal to said higher-frequency operating circuit block and said slower-frequency operating circuit block, respectively.

9. The circuit structure according to claim 8, wherein said higher-frequency operating circuit block comprises memory including faster switching transistors and said slower-frequency operating circuit block comprises memory including slower switching transistors.

10. The circuit structure according to claim 9, comprising a plurality of faster data lines and a plurality of separate slower data lines for transferring data to or from said faster memory and said slower memory, respectively.

11. A microelectronic circuit comprising:
the circuit structure according to claim 10;
power supply circuitry configured to selectively supply said first back gate bias and said second back gate bias to said first back gate line and said second back gate line, respectively, through separate first interconnections;
clock generating circuitry configured to independently supply said higher-frequency clock signal and said lower-frequency clock signal to said first clock line and said second clock lines, respectively, through separate second interconnections; and
memory control circuitry connected to said plurality of faster data lines and said plurality of slower data lines through separate third interconnections and configured to selectively control said faster address lines and said slower data lines to transfer data to or from the faster memory and the slower memory, respectively.

12. The circuit structure according to claim 6, wherein said first circuit block comprises a processor and said second circuit block comprises a memory, the processor comprising said first group of transistors and the memory comprising said second group of transistors.

13. A microelectronic circuit comprising:
the circuit structure according to claim 1; and
power supply circuitry configured to selectively supply the first back gate bias and the second back gate bias to said first back gate line and said second back gate line, respectively, through separate interconnections.

14. The microelectronic circuit according to claim 13, wherein said power supply circuitry is configured to dynamically vary said first back gate bias independently from the second back gate bias.

15. The microelectronic circuit according to claim 13, wherein said power supply is configured to provide a constant first back gate bias independent of the second back gate bias.

16. The microelectronic circuit according to claim 13, wherein said power supply circuitry is configured to selectively supply said first back gate bias to said first back gate line for compensating for variations of one or nominal parameters of the transistors of said first group.

17. The microelectronic circuit structure of claim 1, wherein the first back gate lines are configured to be dynamically biased independently of the second back gate lines.

18. The microelectronic circuit structure of claim 1, wherein the end of first back gate lines laterally protrudes outward from a vertical edge of the first group of the transistors.

* * * * *